(12) United States Patent
Seki et al.

(10) Patent No.: US 6,538,387 B1
(45) Date of Patent: Mar. 25, 2003

(54) SUBSTRATE ELECTRODE PLASMA GENERATOR AND SUBSTANCE/MATERIAL PROCESSING METHOD

(75) Inventors: Shunichi Seki, Suwa (JP); Tatsuya Shimoda, Suwa-gun (JP); Takeshi Izaki, Tokyo (JP); Kazuo Terashima, Mitaka (JP)

(73) Assignees: Seiko Epson Corporation, Tokyo (JP); Kazuo Terashima, Tokyo (JP)

( * ) Notice: Subject to any disclaimer, the term of this patent is extended or adjusted under 35 U.S.C. 154(b) by 0 days.

(21) Appl. No.: 09/555,018

(22) PCT Filed: Sep. 24, 1999

(86) PCT No.: PCT/JP99/05228

§ 371 (c)(1),
(2), (4) Date: May 23, 2000

(87) PCT Pub. No.: WO00/18198

PCT Pub. Date: Mar. 30, 2000

(30) Foreign Application Priority Data

Sep. 24, 1998 (JP) .................................. 10-270349
Sep. 25, 1998 (JP) .................................. 10-272125

(51) Int. Cl.$^7$ ................................................. H05H 1/00
(52) U.S. Cl. ............................ 315/111.21; 204/192.32; 438/729
(58) Field of Search ................... 315/111.21, 111.31, 315/111.71, 111.91; 204/192.32, 192.38; 438/706, 707, 710, 729

(56) References Cited

U.S. PATENT DOCUMENTS

| | | | | | |
|---|---|---|---|---|---|
| 4,566,006 | A | * | 1/1986 | Okamoto et al. | 315/111.21 |
| 5,272,417 | A | * | 12/1993 | Ohmi | 315/111.21 |
| 5,650,377 | A | * | 7/1997 | Kern et al. | 505/330 |
| 5,669,583 | A | | 9/1997 | Roth | 244/130 |
| 5,789,867 | A | * | 8/1998 | Westendorp et al. | 315/111.21 |
| 5,838,111 | A | * | 11/1998 | Hayashi et al. | 315/111.41 |
| 5,859,500 | A | * | 1/1999 | Munemasa et al. | 315/111.21 |
| 5,942,855 | A | * | 8/1999 | Hopwood | 315/111.51 |
| 6,015,762 | A | | 1/2000 | Yamazaki et al. | 438/788 |
| 6,140,165 | A | * | 10/2000 | Zhang et al. | 438/166 |

OTHER PUBLICATIONS

T. Izaki, K. Terashima and T. Yoshida, "Microscale Plasma Generation with Electrodes Fabricated by Lithography and Properties of the Plasma", Mar. 1998, 45$^{th}$ Applied Physics Association Seminar at Tokyo University of Technology.

* cited by examiner

*Primary Examiner*—Don Wong
*Assistant Examiner*—Thuy Vinh Tran
(74) *Attorney, Agent, or Firm*—Oliff & Berridge, PLC

(57) ABSTRACT

The substrate electrode plasma generating apparatus is constituted of an array of small gap thin film electrode pairs 1, 2, 3, and 4 formed by sputtering and dry etching tungsten on a silicon substrate 5 with an oxidized surface.

15 Claims, 7 Drawing Sheets

SUBSTRATE ELECTRODE PLASMA GENERATOR AND SUBSTANCE/MATERIAL PROCESSING METHOD

TECHNICAL FIELD

The present invention relates to a new plasma generating apparatus and matter and materials processing methods using that apparatus, such as thin film formation, surface processing of substrates or matter, and chemical reactions.

BACKGROUND ART

Materials processing techniques using plasma generating apparatuses are widely used in advanced materials preparation, as currently represented by electronic devices and ULSI. However, the problems with these apparatuses include high costs, large size, high power consumption, difficult processes, and inefficiency in the creation of new matter and materials. In particular, there are no means for generating plasma in arbitrarily small regions and for processing using plasma.

DISCLOSURE OF THE INVENTION

In view of such circumstances, it is an object of the present invention to provide a plasma generating apparatus that is inexpensive, small in size, has low power consumption, allows for simple processing, and makes the creation and development of new matter and materials very efficient. Furthermore it is an object of the present invention to provide methods for processing matter and materials using the plasma generating apparatus, including thin film formation, surface processing, and chemical reactions in a plurality of arbitrarily small regions of a substrate.

In order to achieve these objects, the substrate electrode plasma generating apparatus relating to the present invention has at least one pair of electrodes arranged on a single substrate, generates plasma between the electrode pairs, and generates plasma in an arbitrary gas atmosphere.

In the abovementioned substrate electrode plasma generating apparatus of another embodiment of the present invention, the plasma generated between the abovementioned electrode pairs is direct current plasma or alternating current plasma. Also, in the abovementioned substrate electrode plasma generating apparatus, the abovementioned arbitrary atmosphere is vacuum, gas, or liquid. In the abovementioned substrate electrode plasma generating apparatus, the abovementioned electrode pairs are electrode pairs comprising thin films disposed on a substrate. Also, in the abovementioned substrate electrode plasma generating apparatus, a plurality of electrode pairs disposed on the same substrate, but each of the electrode pairs is controlled independently of the others.

With these substrate electrode plasma generating apparatuses, plasma generated between conventional upper and lower electrodes can form a plurality of small quantities of plasma at any location on the surface of a single substrate.

In order to achieve the abovementioned objects, the matter and materials processing method uses the abovementioned substrate electrode plasma generating apparatus to form thin films comprising any material at any location on a separate substrate or matter. The matter and materials processing method relating to another embodiment of the present invention uses the abovementioned substrate electrode plasma generating apparatus to form thin films comprising arbitrary materials at any position on the same substrate. Furthermore, in the method relating to another embodiment, the source material for said thin films is gas or liquid. Yet another embodiment uses the abovementioned substrate electrode plasma generating apparatus to perform surface processing such as ashing, etching, washing, and reforming of another substrate surface.

Another embodiment uses the abovementioned substrate electrode plasma generating apparatus to cause chemical reactions using arbitrary materials at any position on another substrate. Another embodiment causes chemical reactions using arbitrary materials at any position on the same substrate.

The matter and materials processing methods as discussed above make possible the formation of thin films comprising arbitrary materials on a plurality of arbitrarily small regions of a surface, or make it possible to perform surface processing such as ashing, etching, washing, and reforming, and chemical reactions, on the same or a different substrate. Furthermore, another embodiment uses an inkjet method as the method for supplying arbitrary liquid materials used in the processes.

In yet another embodiment of the matter and materials processing method, said inkjet method uses a plurality of nozzles and supplies one or more types of liquid material.

Particularly with the matter and materials processing method using such an inkjet method, one or a plurality of liquid materials, in the desired quantities, can be supplied easily to a plurality of small plasma formation regions.

BEST MODE FOR CARRYING OUT THE INVENTION

The preferred embodiments are explained below using the drawings.

First Embodiment

Figure 1:
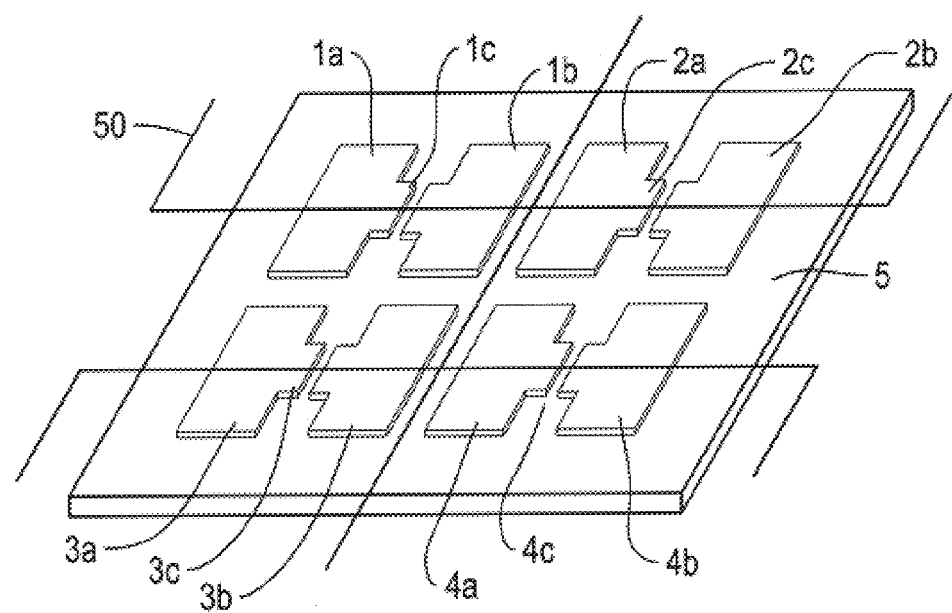
FIG. 1 is a diagram showing the overall constitution of the substrate electrode plasma generating apparatus.

FIG. 1 shows an overall view of the substrate electrode plasma generating apparatus. Tungsten is sputtered and deposited on a silicon substrate 5 with an oxidized surface and small gap thin film electrode pairs 1–4 are formed with dry etching. A plasma array apparatus, comprising four pairs of plasma generating electrodes in a two by two arrangement, is shown here, but an arrangement of any number at any location, according to the desired plasma processing, is acceptable. Each of electrode is wired together in a matrix form so that plasma can be generated between any pair of electrodes. Also, plasma generation may be controlled by the application of voltage between any pair of electrodes by active elements such as transistors. Voltage is supplied through element 50.

Figure 2:
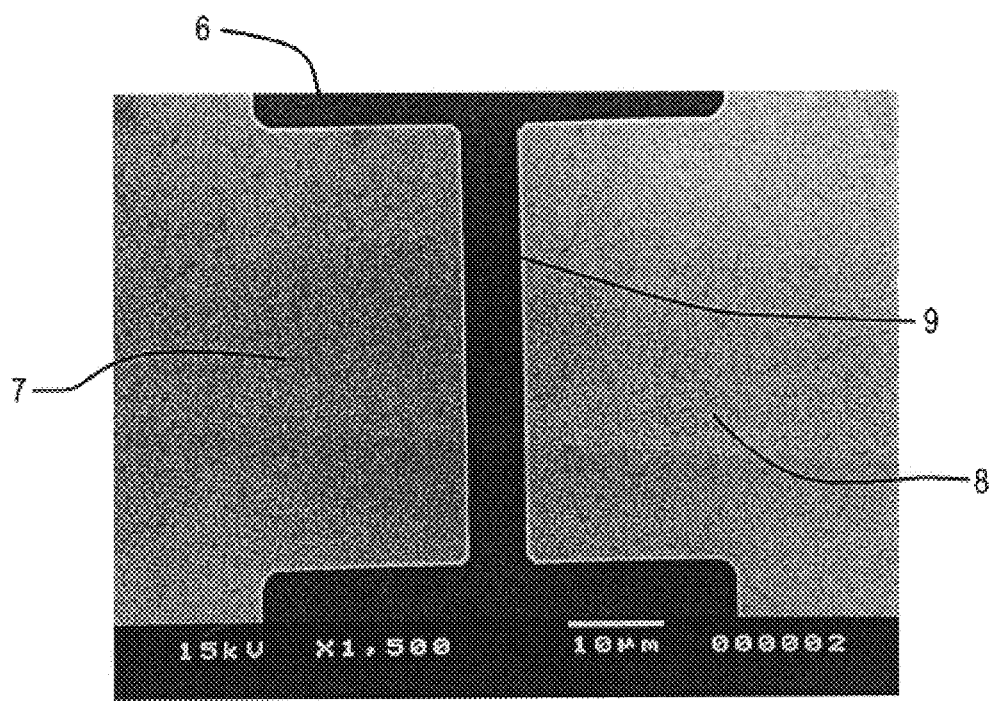
FIG. 2 is a view from above, using a scanning electron microscope, of a pair of substrate electrodes.

FIG. 2 is a micrograph of a pair of substrate electrodes taken with a scanning electron microscope. Tungsten electrodes 7 and 8 are formed with a 5 $\mu$m gap 9 between the electrodes. The size of the substrate electrodes may be on the order of $\mu$m to cm.

TABLE 1

| Pressure (atm) | 0.5 | 1 | 1.5 | 2 | 2.5 | 3 | 3.5 | 4 | 4.5 | 5 |
|---|---|---|---|---|---|---|---|---|---|---|
| Breakdown voltage (V) | 330 | 340 | 310 | 280 | 270 | 280 | 280 | 290 | 300 | 320 |

Table 1 shows the relationship between pressure and break-down voltage in an argon atmosphere.

Also, plasma generation in air or hydrogen at one atm was observed at an applied voltage of 400 V with both tungsten and platinum electrodes having gaps of 5 $\mu$m to 10 $\mu$m therebetween.

Figure 3A:
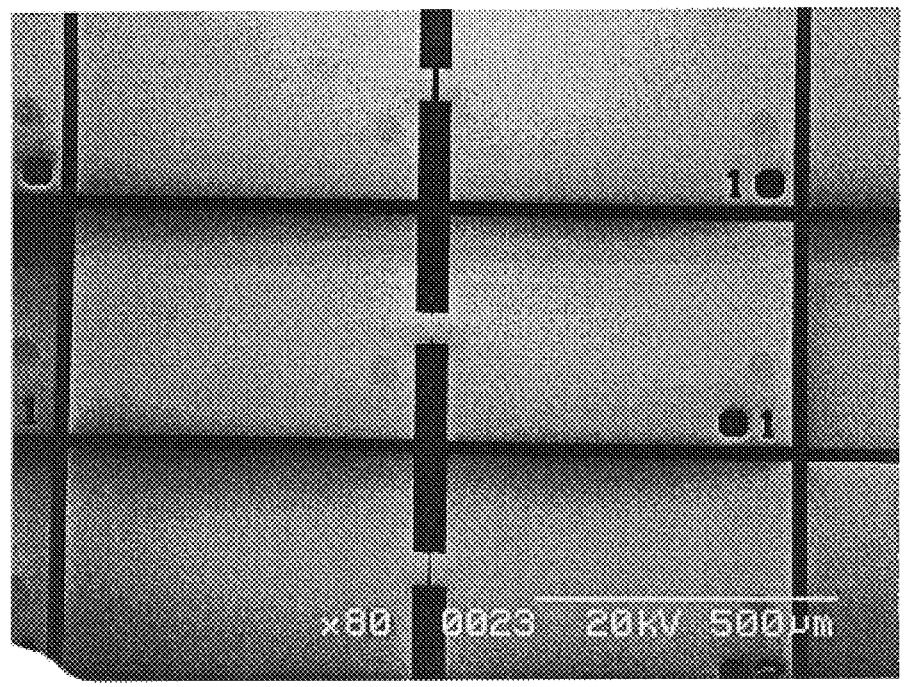
FIGS. 3(A)–3(B) are views using a scanning electron microscope of a substrate electrode; 3(A) is a view from above the substrate electrode array; and 3(B) is a side view of the vicinity of the plasma generation area.
Figure 3B:
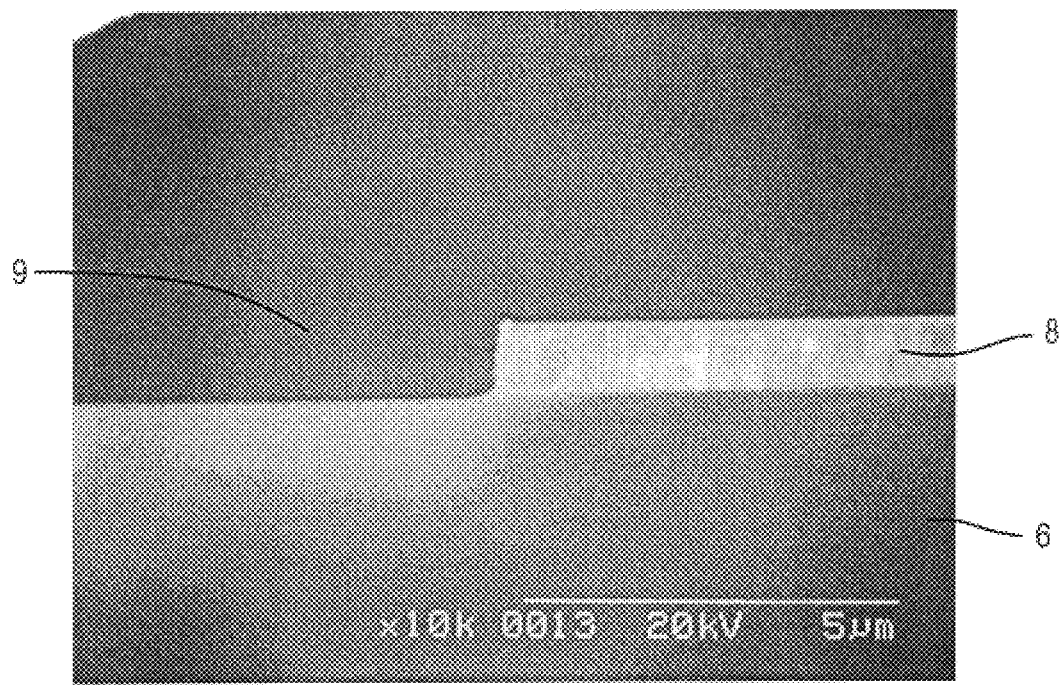

FIG. 3(A) shows a micrograph from above the substrate electrode array. FIG. 3(B) shows a micrograph of the vicinity of the plasma generation area 9 seen from the side.

Figure 4A:
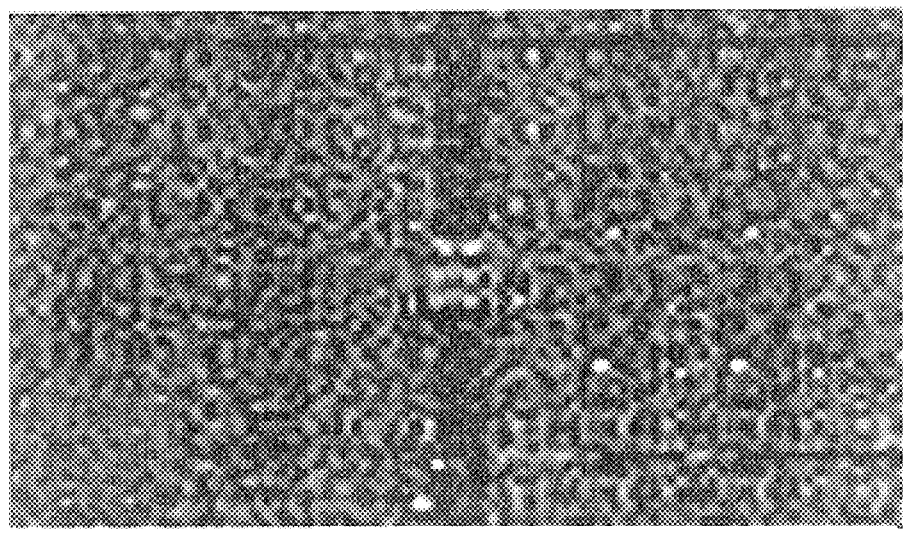
FIGS. 4(A)–4(B) are diagrams showing the situation of plasma generation with the substrate electrodes shown in FIG. 2; 4(A) shows before plasma generation; 4(B) shows during plasma generation.
Figure 4B:
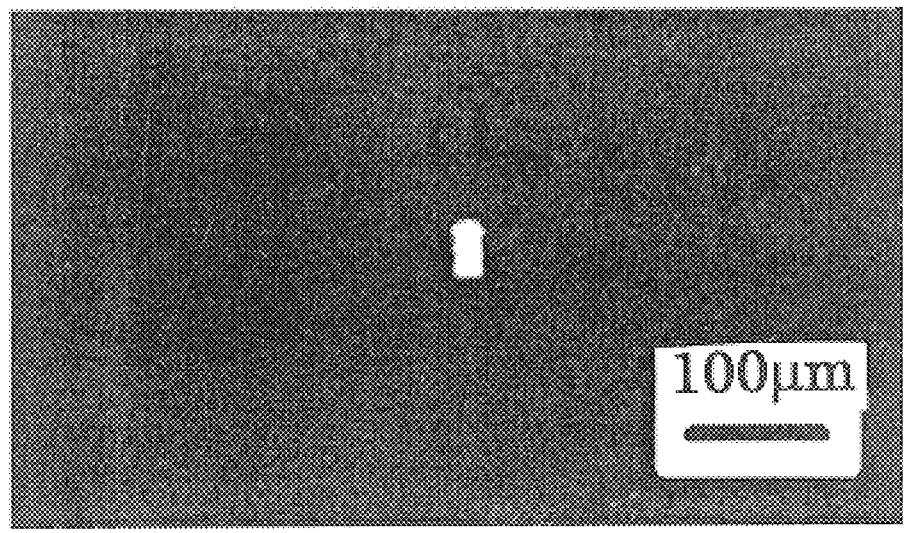

FIG. 4 is a diagram showing the situation of plasma generation with the substrate electrodes; (A) shows before plasma generation; (B) shows during plasma generation.

Before now, there were no examples of plasma being generated in micro-regions using electrodes on a substrate; this first became possible with the present invention. The substrate electrode plasma generating apparatus makes possible micro-fine plasma generation at a plurality of arbitrary locations on a single substrate surface.

Second Embodiment

FIG. 5 is a diagram showing the process for forming various thin films at arbitrary locations on the same or separate substrates using the substrate electrode plasma generating apparatus 10. As shown in FIG. 5(a), the silicon substrate 12 is positioned opposite to the substrate electrode plasma generating apparatus 10; an $SiO_2$ thin film 13 can be formed at any desired position by generating plasma 11 at that position while triethoxysilane (TEOS) gas is introduced into an air or oxygen gas atmosphere. In FIG. 5(b), an aluminum thin film 15 is formed when plasma 14 is generated at another electrode pair while trimethoxyaluminum (TMA) is introduced into vacuum. Next, FIG. 5(c) shows the formation of a silicon thin film 16 at a separate location as monosilane ($SiH_4$) is introduced into vacuum. In this way, it becomes possible to use the substrate electrode plasma generating apparatus 10 to form and pattern thin films comprising arbitrary materials at arbitrary locations by varying the reaction gas. Furthermore, it becomes possible to form various elements such as TFT's at arbitrary positions by introducing apparatuses for laser abrasion and ion doping.

Figure 5A:
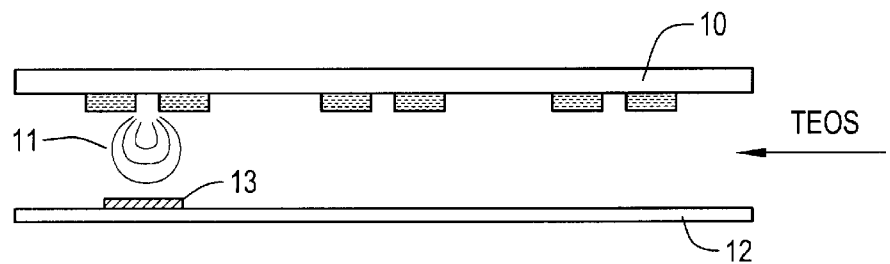
FIGS. 5(A)–5(B) shows the process for forming various thin films at arbitrary locations on the same or a different substrate using the substrate electrode plasma generating apparatus.
Figure 5B:
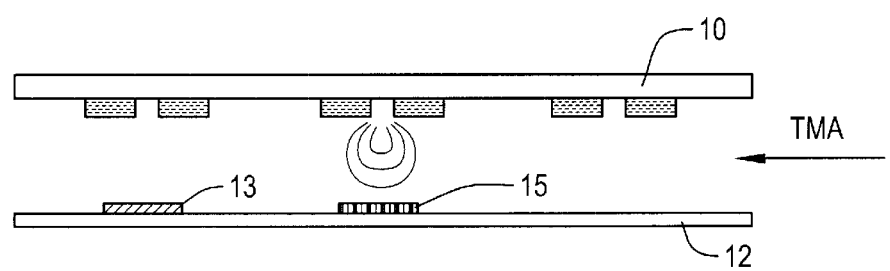
Figure 5C:
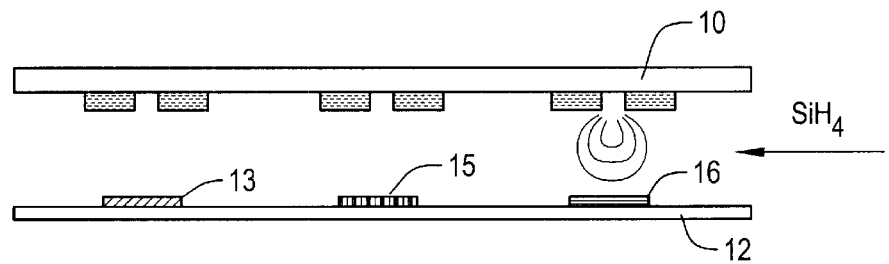
Figure 5D:
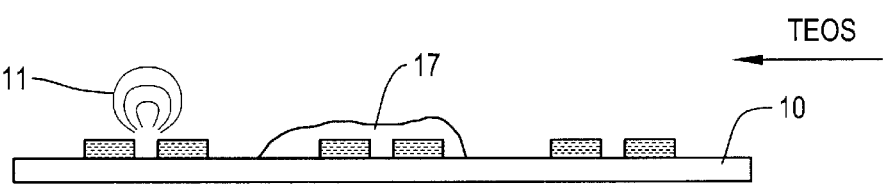
Figure 6A:
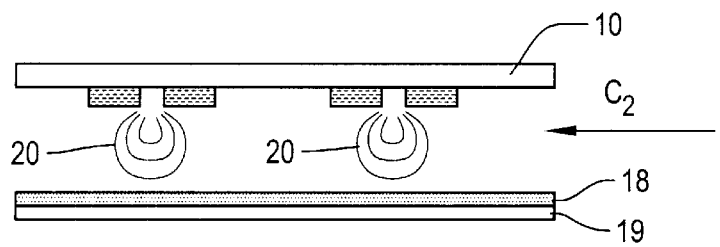
FIGS. 6(A)–6(B) shown a substrate surface processing method using the substrate electrode plasma generating apparatus.
Figure 6B:
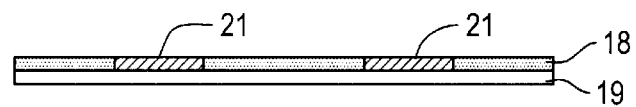
Figure 6C:
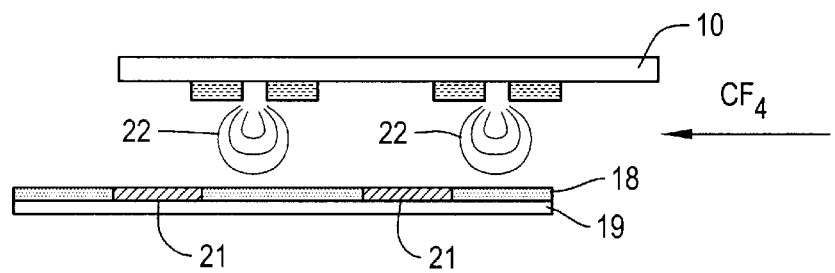
Figure 6D:
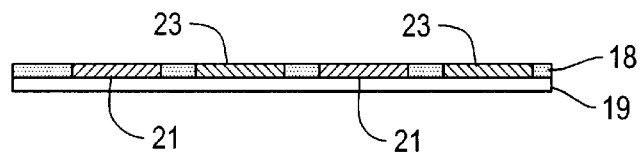
Figure 7A:
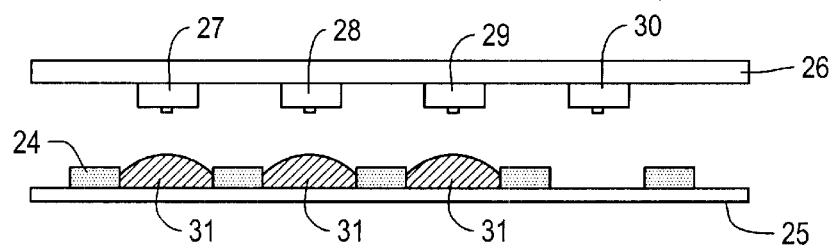
FIGS. 7(A)–7(B) show a process for forming micro-optical thin films with a combination of the substrate electrode plasma generating apparatus and an inject printing apparatus.
Figure 7B:
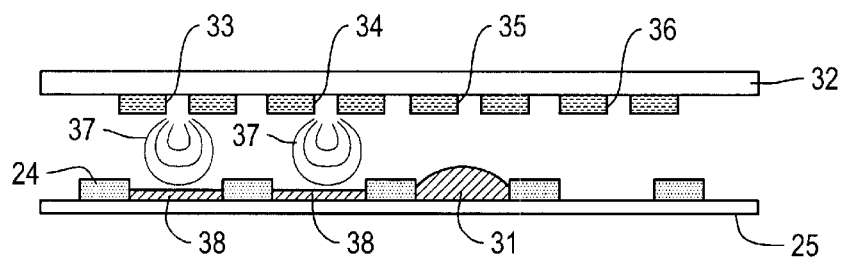
Figure 7C:
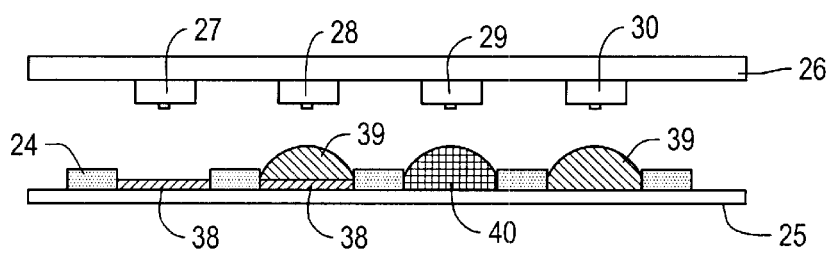
Figure 7D:
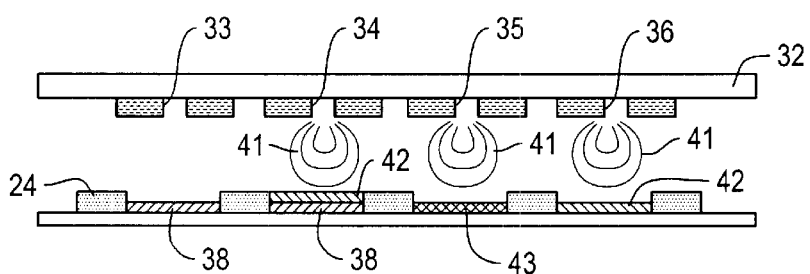

FIG. 5(d) shows the formation of an $SiO_2$ insulating film 17 on the same substrate as the substrate electrode plasma generating apparatus 10 with the introduction of triethoxysilane (TEOS). Controlling the type of reaction gas and the plasma generation region makes it possible to form thin films, semiconductor films, and so forth on the same substrate at any location.

Also, it is possible to form acrylic on the substrate by plasma polymerization through generating plasma while a reaction material that is not gas, but rather a liquid such as acrylic monomer, is introduced. Micro-optical elements with differing refractive indexes can also be formed on the same substrate by controlling the type of monomer and plasma conditions.

Third Embodiment

FIG. 6 shows the process for surface processing of a substrate using the substrate electrode plasma generating apparatus 10. A substrate comprising a polyimide film 18 formed on a glass substrate 19 undergoes plasma 20 processing in an oxygen atmosphere. This may be done in air or as oxygen gas is introduced. As shown in FIG. 6(b), arbitrary locations 21 of the surface may be made hydrophilic. This oxygen plasma processing also has ashing effects on the polyimide residue. Next, a hydrophobic surface 23 can be formed by shifting the substrate or the substrate electrode plasma generating apparatus and performing plasma 22 processing for the unprocessed polyimide surface while $CF_4$ gas is introduced. The reaction gas may also be another fluorine gas such as $SiF_4$. Accordingly, it becomes possible to reform any location 23 of the surface on the same substrate to have hydrophilic or hydrophobic properties, as shown in FIG. 6(d).

Fourth Embodiment

FIG. 7 shows the process for forming micro-optical thin films with a combination of the substrate electrode plasma generating apparatus and an inkjet printing apparatus. From an inkjet printing apparatus 26, having inkjet heads 27, 28, 29, 30, $SiO_2$ precursor ink 31 is sprayed and patterned from inkjet heads 27, 28, and 29 onto a desired glass surface on a glass substrate 25 having partitions 24 formed of polyimide. For example, liquid including polysilazane is preferred as the $SiO_2$ precursor ink. Plasma 37 is generated with substrate electrode pairs 33 and 34 and an $SiO_2$ thin film 38 is formed using the substrate electrode plasma generating apparatus 32 comprising substrate electrode pairs 33, 34, 35, and 36. Furthermore, as shown in FIG. 7(c), $TiO_2$ precursor ink 39 is sprayed from inkjet heads 28, 29, and 30. A liquid 40 including a metal alkoxide such as titanium tetraisopropoxide is used as the $TiO_2$ precursor ink. Finally, plasma 41 is generated with substrate electrode pairs 34, 35, and 36 and a $TiO_2$ film 42 and (Si, Ti)$O_2$ mixed film 43 are formed. Consequently, combining the substrate electrode plasma generating apparatus and inkjet printing apparatus as shown in FIG. 7(d) makes it possible and simple to form four types of thin films, $TiO_2$, $SiO_2$, $SiO_2$/$TiO_2$ layered film, and (Si, Ti)$O_2$ mixed film, on a single substrate. Optical thin films with different refractive indexes can be formed on the same substrate through the formation of thin films comprising materials with different refractive indexes such as $TiO_2$, $SiO_2$, and $(Si, Ti)O_2$. The formation of a DBR mirror is also made possible by layering thin films with different refractive indexes.

Fifth Embodiment

Figure 8:
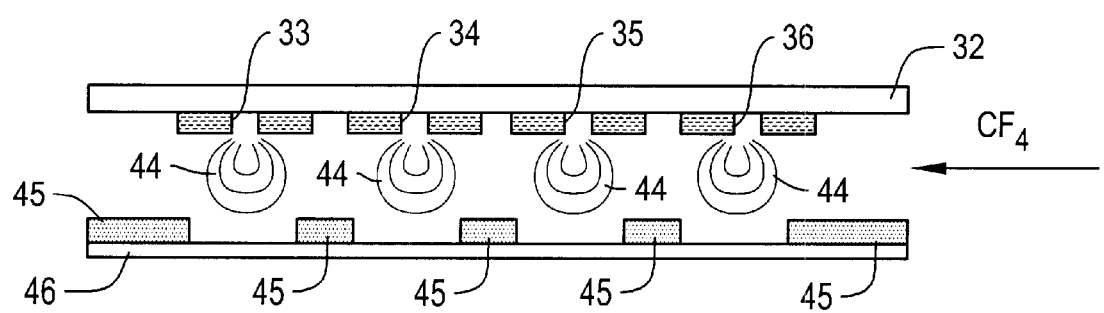
FIG. 8 shows silicon etching using the substrate electrode plasma generating apparatus.

FIG. 8 shows local etching of a silicon substrate 46 using the substrate electrode plasma generating apparatus 32. Etching of silicon at any position, defined between polyimide partitions 45, is possible. A fluorine gas such as $CF_4$ is effective as the atmospheric gas.

INDUSTRIAL APPLICABILITY

As discussed above, the substrate electrode plasma generating apparatus relating to the present invention is smaller, more inexpensive, and consumes less power than a conventional plasma apparatus, and furthermore, makes possible simple and highly efficient matter and materials processing methods such as the formation of functional thin films at a plurality of tiny regions anywhere on a substrate, surface processing, and chemical reactions. Combining the plasma generating apparatus with an inkjet printing apparatus makes possible simple functional thin film formation and matter and materials processing for a wide range of the abovementioned functional thin films and matter and materials.

What is claimed is:

1. A substrate electrode materials processing apparatus for performing processing upon a material in an arbitrary atmosphere, the apparatus comprising:

a single substrate;

at least one pair of electrodes disposed on the single substrate that generate plasma between the at least one pair of electrodes in the arbitrary atmosphere, the at least one pair of electrodes and the substrate being disposed at a position relative to the material to enable the plasma generated to perform processing upon the material.

2. The substrate electrode materials processing apparatus according to claim 1, wherein said electrode gap is small and plasma is generated in small regions between said pair of electrodes.

3. The substrate electrode materials processing apparatus according to claim 1, wherein said electrode gap is 5 $\mu$m to 10 $\mu$m.

4. The substrate electrode materials processing apparatus according to claim 1, wherein the plasma generated with said electrode pairs is direct current plasma, alternating current plasma, or high frequency plasma.

5. The substrate electrode materials processing apparatus according to claim 1, wherein said arbitrary atmosphere is vacuum, gas, or liquid.

6. The substrate electrode materials processing apparatus according to claim 1, wherein said electrode pairs are electrode pairs comprising thin films established on a substrate.

7. The substrate electrode materials processing apparatus according to claim 1, wherein a plurality of electrode pairs is established on a single substrate, while each of said electrode pairs is controlled independently.

8. A matter and materials processing method for performing processing upon a material in an arbitrary atmosphere, comprising:

providing at least one pair of electrodes on a single substrate that is spaced from the material;

generating plasma between the at least one pair of electrodes, and disposing the at least one pair of electrodes and the single substrate at a position relative to the material so that the plasma generated forms thin films that include arbitrary positions on the material.

9. The matter and materials processing method according to claim 8, wherein the disposing step includes forming thin films having a source material that is a gas or liquid.

10. The matter and materials processing method according to claim 8, further including supplying an arbitrary liquid material using an inkjet method; wherein the disposing step includes forming thin films that include the arbitrary liquid material.

11. The matter and materials processing method according to claim 10, wherein the supplying step includes using a plurality of nozzles to supply at least one type of liquid material in said inkjet method.

12. A matter and materials processing method for performing processing upon a substrate in an arbitrary atmosphere, comprising:

providing at least one pair of electrodes on the substrate;

generating plasma between the at least one pair of electrodes; and disposing the at least one pair of electrodes and the single substrate so that the plasma generated forms thin films that include arbitrary materials at arbitrary positions on the substrate.

13. A matter and materials processing method for performing processing upon a material in an arbitrary atmosphere, comprising:

providing at least one pair of electrodes on a single substrate that is spaced from the material;

generating plasma between the at least one pair of electrodes; and disposing, the at least one pair of electrodes and the single substrate at a position relative to the material so that the plasma generated performs at least one type of surface processing selected from among ashing, etching, washing, and reforming of the material surface.

14. A matter and materials processing method for performing processing upon a material in an arbitrary atmosphere, comprising:

providing at least one pair of electrodes on a single substrate that is spaced from the material;

generating plasma between the at least one pair of electrodes; and disposing, the at least one pair of electrodes and the single substrate at a position relative to the material so that the plasma generated effects chemical reactions using an arbitrary material at arbitrary positions on the material.

15. A matter and materials processing method for performing processing upon a substrate in an arbitrary atmosphere, comprising:

providing at least one pair of electrodes on the substrate;

generating plasma between the at least one pair of electrodes; and disposing the at least one pair of electrodes and the single substrate so that the plasma effects chemical reactions using an arbitrary material at arbitrary positions on the substrate.

* * * * *